US006388526B1

(12) United States Patent
Daniel et al.

(10) Patent No.: US 6,388,526 B1
(45) Date of Patent: May 14, 2002

(54) METHODS AND APPARATUS FOR HIGH PERFORMANCE RECEPTION OF RADIO FREQUENCY COMMUNICATION SIGNALS

(75) Inventors: Tom T. Daniel, Edison; Elias Bonaventure Kpodzo, Franklin Park; Mark J. Van De Walle, Colts Neck, all of NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/610,795

(22) Filed: Jul. 6, 2000

(51) Int. Cl.$^7$ .................................................. H03G 3/10
(52) U.S. Cl. ...................... 330/285; 330/136; 330/140; 330/141; 330/281
(58) Field of Search .................. 330/136, 140, 330/141, 281, 285

(56) References Cited

U.S. PATENT DOCUMENTS

| | | | |
|---|---|---|---|
| 5,168,871 A | * 12/1992 | Grevious | 128/419 PT |
| 5,371,477 A | * 12/1994 | Ikeda et al. | 330/282 |
| 5,507,023 A | * 4/1996 | Suganuma et al. | 455/234.1 |
| 5,589,797 A | * 12/1996 | Gans et al. | 330/149 |
| 5,789,983 A | * 8/1998 | Fujita | 330/277 |
| 5,886,547 A | * 3/1999 | Durec et al. | 327/113 |
| 5,907,798 A | 5/1999 | Abramsky et al. | 455/249.1 |
| 5,909,645 A | 6/1999 | Abramsky et al. | 455/249.1 |
| 6,005,506 A | * 12/1999 | Bazarjani et al. | 341/143 |
| 6,134,430 A | * 10/2000 | Younis et al. | 455/340 |
| 6,181,206 B1 | * 1/2001 | Palmisano et al. | 330/278 |
| 6,218,899 B1 | * 4/2001 | Ezell | 330/254 |
| 6,225,848 B1 | * 5/2001 | Tilley et al. | 327/307 |
| 6,226,504 B1 | * 5/2001 | Takagi | 455/234.1 |

FOREIGN PATENT DOCUMENTS

| JP | 5-145345 | * 6/1993 |
|---|---|---|
| JP | 411069451 | * 3/1999 |

OTHER PUBLICATIONS

IBM TDB "Low–Noise High–Bandwidth Current–Biasing Magnetoresistive Element Preamplifier" vol. 38 #6 pp. 595–596, Jun. 1, 1995.*

* cited by examiner

Primary Examiner—Michael B Shingleton
(74) Attorney, Agent, or Firm—Peter H. Priest (57) ABSTRACT

Circuits for continuously varying the gain control for a low noise amplifier (LNA) of a wireless receiver are described. The gain, input third order intercept point (IIP3) and noise figure (NF) of an LNA are continuously varied according to the received power levels, causing the receiver to utilize less current at different power levels. At high gain levels the IIP3 and NF are at a minimum, while at low gain levels the IIP3 and the NF are at a maximum. By continuously varying the gain of an LNA throughout the operational range, the present invention achieves wider dynamic range and higher power efficiency. According to one aspect, the present invention includes a power coupler and a power detector which are utilized to produce a rectified voltage which is proportional to the input power or output power of an LNA. The rectified voltage is utilized by a control circuit which produces a signal which controls the gain, IIP3 and NF of the LNA. According to another aspect, diode circuitry is utilized to produce the rectified voltage.

16 Claims, 6 Drawing Sheets

METHODS AND APPARATUS FOR HIGH PERFORMANCE RECEPTION OF RADIO FREQUENCY COMMUNICATION SIGNALS

FIELD OF THE INVENTION

The present invention relates generally to improvements in communication receiver circuits. More particularly, the present invention relates to methods and apparatus for high performance reception of radio frequency (RF) communication signals using receiver circuits to dynamically control the gain of a low noise amplifier (LNA) based on received power level.

BACKGROUND OF THE INVENTION

In general, wireless telephones function as mobile stations which allow a user to communicate within a particular geographic serving area. Continuous communication is provided even as the telephone moves about within the service area. Such continuous service is provided in wireless cellular networks by providing base stations throughout the geographic service area. Each base station provides service to a geographic area called a cell.

An increasingly popular wireless digital communication methodology is code division multiple access (CDMA). CDMA provides a means for organizing radio frequency energy over a range of frequencies and moving among the frequency range on a code divided basis. CDMA systems require receivers with a wide dynamic range. When a CDMA mobile system is at the edge of a cell, the CDMA mobile receiver must exhibit a very low noise figure in order to detect the desired low power signal, such as −104 dBm, amidst the surrounding noise. Yet, when the mobile system is close to the base station, the CDMA mobile receiver may receive signals of much greater strength, such as −25 dBm. These two extremes require that the receiver have both a very low noise figure (NF) and a very high input third order intercept point (IIP3). However, it is not necessary to achieve both requirements simultaneously. For example, at low power levels a low noise figure is essential while only a moderate level of IIP3 is necessary to prevent desensitization of the receiver due to noise. Yet, at high power levels a high IIP3 is needed, irrespective of the noise figure.

Due to these dual requirements, most prior art CDMA receivers incorporate some form of gain control into a low noise amplifier (LNA) of the receiver which changes the receiver from a low noise figure, high gain state to a low gain, high IIP3 state. These prior art approaches, which typically use switches or a digital signal processor (DSP) to change the state of the LNA, suffer from numerous drawbacks. For example, the insertion loss of the switches contributes to the noise figure and degrades performance when operating in the high gain state. Further, the switches allow only two states of gain control to be utilized. Due to the processing delays of the DSP, typically only three states of gain control can be utilized and significant errors can be introduced into the system by the delays. In both of the prior art approaches, current is wasted when the receiver is operated inefficiently due to the limited number of gain control states. Typical prior art systems control the gain based on a baseband signal derived from the received RF signal, resulting in substantial latency when changing the gain.

Accordingly, it would be highly advantageous to provide continuously variable gain control for the LNA of a wireless receiver such that the gain, IIP3 and noise figure are continuously varied according to input RF power levels.

SUMMARY OF THE INVENTION

The present invention provides methods and apparatus for providing continuously variable gain control for a low noise amplifier of a RF wireless receiver. The gain, IIP3 and NF of an LNA are continuously varied according to the received power levels, causing the receiver to utilize less current at different power levels. For example, at high gain levels the IIP3 and NF are at a minimum, while at low gain levels the IIP3 and the NF are at a maximum. By continuously varying the gain of the LNA throughout the operational range, the present invention advantageously achieves wider dynamic range and higher power efficiency than typical prior art approaches.

According to one aspect, the present invention includes a power coupler and a power detector which are utilized to produce a rectified voltage which is proportional to the input power or output power of an LNA. The rectified voltage is utilized by a control circuit which produces a signal which controls the gain, IIP3 and NF of the LNA. According to another aspect, diode circuitry is utilized to produce the rectified voltage.

By controlling the gain of the LNA based on the RF signal power level present at the input or the output of the LNA, the present invention advantageously minimizes the delay in controlling the gain, allowing a wireless receiver to react quickly to changes in received signal strength, especially when fading occurs.

A more complete understanding of the present invention, as well as further features and advantages, will be apparent from the following Detailed Description and the accompanying drawings.

DETAILED DESCRIPTION

The present invention will be described more fully hereinafter with reference to the accompanying drawings, in which several presently preferred embodiments of the invention are shown. This invention may, however, be embodied in various forms and should not be construed as limited to the embodiments set forth herein. Rather, these embodiments are provided so that this disclosure will be thorough and complete, and will fully convey the scope of the invention to those skilled in the art.

While the discussion which follows is for CDMA receivers and amplifiers operating at frequencies of substantially 200 MHz and greater, it will be recognized that the teachings of the present invention are widely applicable to other devices requiring biasing of the nature described herein to improve their operation. For example, it will be recognized that the present invention may be adapted to other RF communication systems operating at frequencies of substantially 200 MHz and greater, such as time division multiple access (TDMA) systems and global system mobile communication (GSM) systems, as well as other types of systems and receivers.

Most amplifiers or electronic components are to some extent nonlinear in their behavior. When multiple signals are applied to an input of an amplifier, the output of the amplifier will contain the original signals as well as new signals generated by the amplifier itself. The strongest of the signals generated by the amplifier are third order intermodulation products which are usually located very close to the desired signals and thus cannot be easily filtered out. The input third order intercept point (IIP3) is an important measure of system or amplifier linearity. The IIP3 is the point at which the desired signal and the third order distortion products are substantially equal in amplitude. The IIP3 defines the amount of intermodulation distortion in the amplifier when the amplifier is subjected to a high-level interference signal.

The noise figure (NF), also known as "Fr", is an important parameter specification for an amplifier or a receiver. The noise figure is related to a noise factor (fr) of an amplifier or a receiver by the equation:

$$Fr = 10 \log fr \; [\text{in dB}]$$

The noise factor of any two port element or system is defined as the ratio of a total noise power at an output of the element to a portion of the output power generated by the input termination of the two port element or system, when the input termination is at 288° Kelvin. The noise factor provides a measure of noise added by the amplifier or receiver in excess of the noise generated by the input termination.

Figure 1:
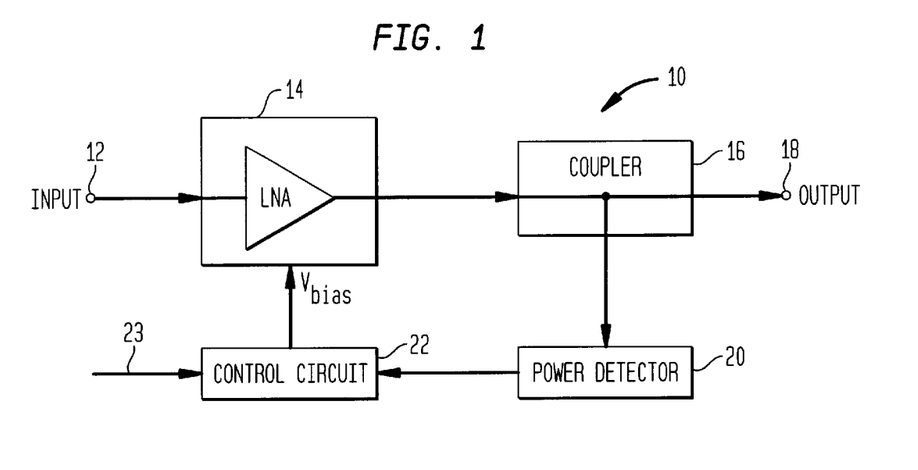
FIG. 1 is a block diagram of a first embodiment of a variable low noise amplifier circuit in accordance with the present invention.

FIG. 1 shows a block diagram of a circuit 10 for providing a variable low noise amplifier (LNA) for use in a radio frequency (RF) communication receiver in accordance with a first embodiment of the present invention. The circuit 10 includes an input 12 connected to a first input of an LNA 14. An output of the LNA 14 is connected to an input of a power coupler 16. A first output of the power coupler 16 is connected to an output 18 of the circuit 10, while a second output of the power coupler 16 is connected to an input of a power detector 20. An output of the power detector 20 is connected to a first input of a control circuit 22. An output of the control circuit 22 is connected to a control input of the LNA 14. A front end control signal (FECS) 23 may suitably be connected to a second input of the control circuit 22. Signal flow through the circuit 10 is from the input 12 to the output 18 and is indicated by the arrows shown in FIG. 1. This signal flow convention is also used in the following embodiments of the present invention, described in more detail below.

An input radio frequency (RF) signal provided to the input 12 is amplified by the LNA 14 and passed through the power coupler 16 to the output 18. A fraction of the amplified signal is coupled by the power coupler 16 to the input port of the power detector 20. The fraction of the amplified signal which is coupled is typically 20% or less than the amplified signal, allowing the integrity of the amplified signal to be maintained. The power detector 20 detects the coupled power and produces a rectified voltage which is passed to the control circuit 22. To improve the sensitivity of the power detector 20, the power detector 20 may include an amplifier to provide additional gain and allow less power to be coupled by the power coupler. As described in further detail below, based on the rectified voltage signal, the control circuit 22 sets the gain of the LNA 14 by adjusting the bias voltage ($V_{bias}$) of the LNA 14. The bias voltage may suitably be the gate-source voltage ($V_{gs}$) or the base-emitter voltage ($V_{be}$) of the LNA 14. The FECS may be utilized to override the control circuit and set the bias voltage to a given value, as described below.

Figure 2:
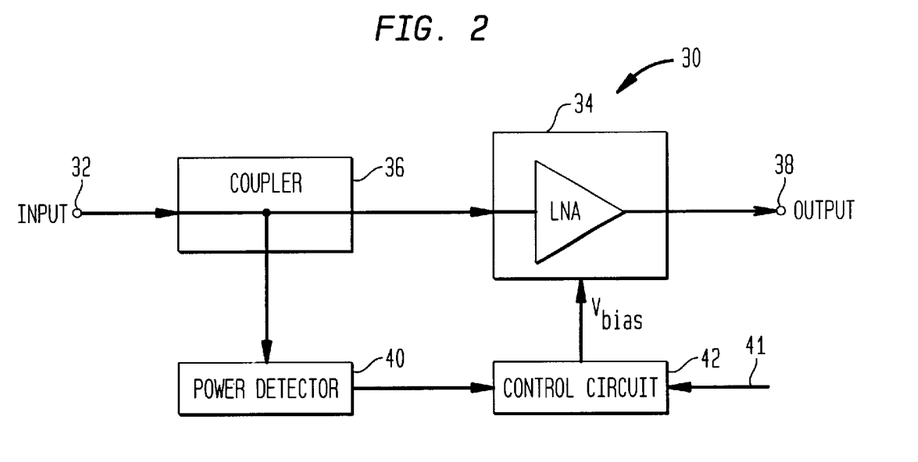
FIG. 2 is a block diagram of a second embodiment of a variable low noise amplifier circuit in accordance with the present invention.

FIG. 2 shows a block diagram of a circuit 30 for providing a variable low noise amplifier (LNA) for use in a RF communication receiver in accordance with a second embodiment of the present invention. The circuit 30 includes an input 32 connected to an input of a power coupler 36. A first output of the power coupler 36 is connected a first input of a LNA 34, while a second output of the coupler 36 is connected to an input of a power detector 40. An output of the LNA 34 is connected to an output 38 of the circuit 30. An output of the power detector 40 is connected to a first input of a control circuit 42. A front end control signal (FECS) 41 may suitably be connected to a second input of the control circuit 42. An output of the control circuit 42 is connected to a second input of the LNA 34.

An input radio frequency (RF) communication signal provided to the input 32 is passed from the power coupler 36 to the LNA 34, amplified by the LNA 34 and passed to the output 38. A fraction of the input signal is coupled by the power coupler 36 to the power detector 40 which detects the coupled power and produces a rectified voltage. The rectified voltage signal is passed to the control circuit 42. Based on the rectified voltage signal, the control circuit 42 sets the gain of the LNA 34 by adjusting the bias voltage ($V_{bias}$) of the LNA 34. The bias voltage may be suitably the gate-source voltage ($V_{gs}$) or the base-emitter voltage ($V_{be}$) of the LNA 34. The FECS may be utilized to override the control circuit and set the bias voltage to a given value, as described in greater detail below.

Figure 3:
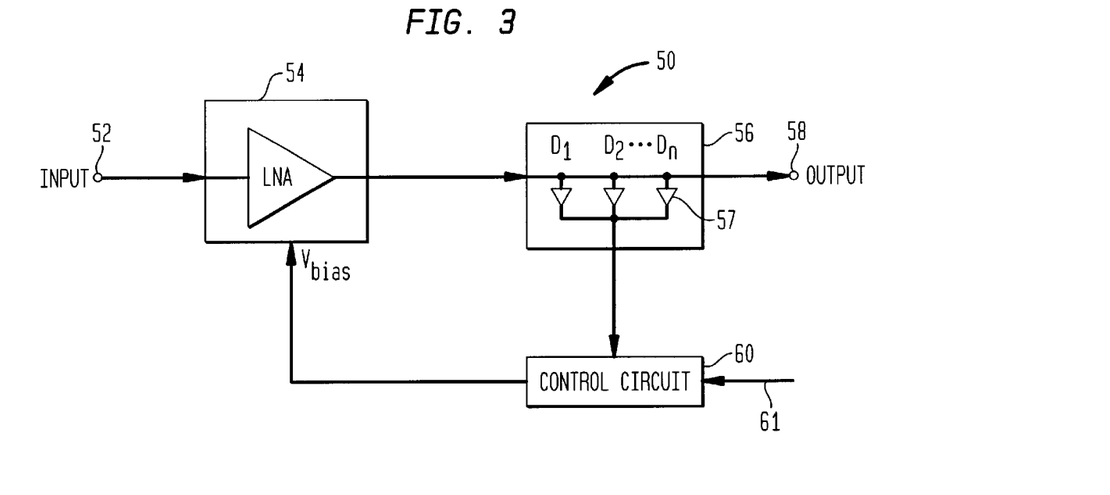
FIG. 3 is a block diagram of a third embodiment of a variable low noise amplifier circuit in accordance with the present invention.
Figure 4:
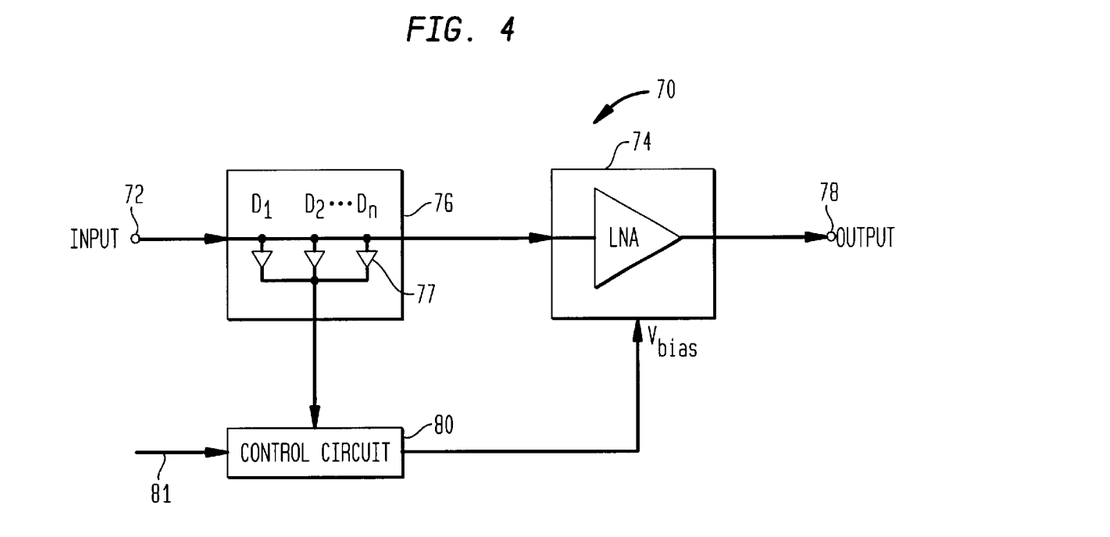
FIG. 4 is a block diagram of a fourth embodiment of a variable low noise amplifier circuit in accordance with the present invention.

FIG. 3 shows a block diagram of a circuit 50 for providing a variable low noise amplifier (LNA) in accordance with a third embodiment of the present invention. The circuit 50 includes an input 52 connected to a first input of an LNA 54. An output of the LNA 54 is connected to an input of a diode detector circuit 56 comprising one or more diodes 57. A first output of the diode detector circuit 56 is connected to an output 58 of the circuit 50, while a second output of the diode detector circuit 56 is connected to a first input of a control circuit 60. A front end control signal (FECS) 61 may be suitably connected to a second input of the control circuit 60. An output of the control circuit 60 is connected to a control input of the LNA 54. FIG. 4 shows a block diagram of a circuit 70 for providing a variable low noise amplifier (LNA) in accordance with a fourth embodiment of the present invention. Like the circuit 50, the circuit 70 employs a diode detector circuit instead of the power coupler and power detector utilized by the first and second embodiments described above. The circuit 70 includes an input 72 connected to an input of a diode detector circuit 76 comprising one or more diodes 77. A first output of the diode detector circuit 76 is connected to a first input of an LNA 74, while a second output of the diode detector circuit 76 is connected to a first input of a control circuit 80. A front end control signal (FECS) 81 may be suitably connected to a second input of the control circuit 80. An output of the LNA 74 is connected to an output 78 of the circuit 70. An output of the control circuit 80 is connected to a control input of the LNA 74.

The diode detector circuits operate as radio frequency (RF) power detectors and in a preferred embodiment are implemented using one or more Schottky diodes. The diodes may be constructed from silicon, germanium or gallium arsenide semiconductor materials. If a single diode is used, the diode should preferably be a Schottky diode, with high sensitivity to cover a range of power levels to be detected. The diode detector circuit may also consist of multiple diodes, such as diodes D1, D2, . . . Dn shown in FIGS. 3 and 4, with variable voltage sensitivity. For a multiple diode embodiment, the diodes should be of multiple gate widths, selected to ensure 15 to 20 dB of isolation between the diodes. Depending on the power level received at the input of the diode detector circuit, the diodes will turn ON, producing a voltage signal that represents the power of the RF signal at the input of the diode detector circuit. The diode detector circuits perform substantially the same function as the coupler and the power detector of the first and second embodiments.

Based on the rectified voltage signal, the control circuits 60 and 80 set the gain of the LNAs 54 and 76 by adjusting the bias voltage ($V_{bias}$) of the LNAs. The bias voltage may be suitably the gate-source voltage ($V_{gs}$) or the base-emitter voltage ($V_{be}$) of the LNAs. The FECS may be suitably utilized to override the control circuit and set the bias voltage to a given value.

Figure 5:
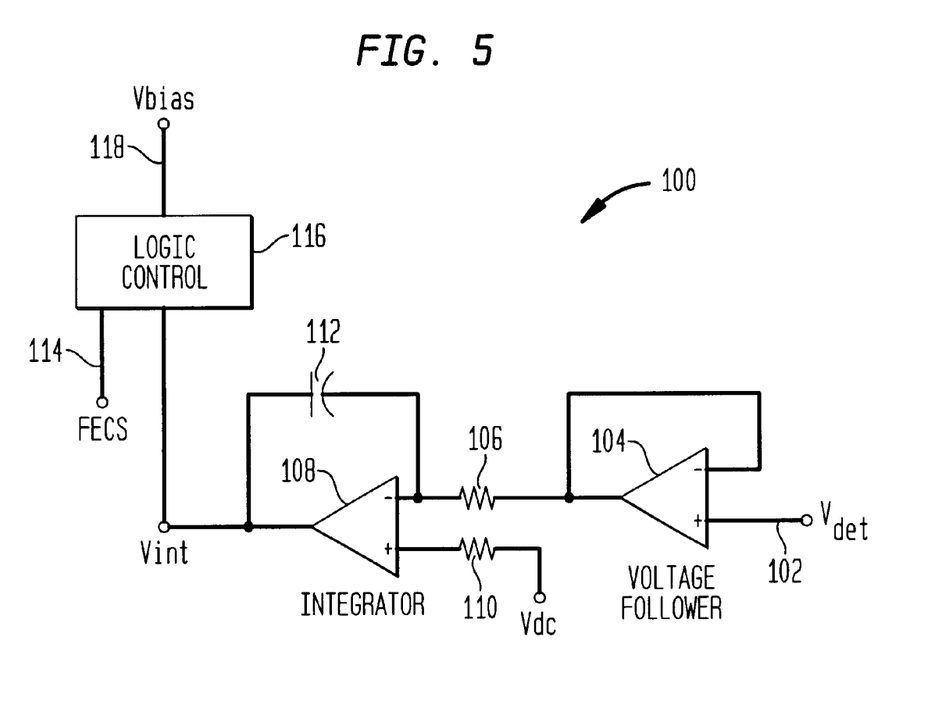
FIG. 5 shows a control circuit for a variable low noise amplifier in accordance with the present invention.

FIG. 5 shows a block diagram of a control circuit 100 suitable for use with the embodiments of the present invention described above. The control circuit 100 includes an input signal 102 connected to an input of an operational amplifier 104 configured as a voltage follower. The input signal corresponds to the output of the power detectors or diode circuits described above. An output of the operational amplifier 104 is connected through a resistor 106 to the inverting input of an operational amplifier 108 configured as an integrator. A resistor 110 is connected between the non-inverting input of the operational amplifier 108 and a direct current voltage source ($V_{dc}$). A capacitor 112 is connected between the inverting input and an output of the operational amplifier 108. The output Vint of the operational amplifier 108 is further connected to a first input of a logic control circuit 116. A front end control signal (FECS) 114 is connected to a second input of the logic control circuit and an output of the logic control circuit is connected to an output signal $V_{bias}$ 118 which controls the biasing of the LNA.

| | |
|---|---|
| Resistor 110 | 10 ohms |
| Resistor 106 | 10 ohms |
| Capacitor 112 | 1 pico Farad |
| Operational Amplifiers | |
| 104 and 108 | Open loop DC voltage gain: 120 dB |
| | Output resistance: 100 ohms |
| | Differential input resistance: 1M ohms |
| | Differential input capacitance: 0 |
| | Signal slew rate: 1 × 10$^9$ volts/second |
| | Unity gain bandwidth: 1 MHz |

The input signal $V_{det}$ 102 is provided to control circuit 100 by the power detector, as described above with respect to the first and second embodiments of the present invention, or by the diode circuit, as described above with respect to the third and fourth embodiments of the present invention. The input signal $V_{det}$ 102 is fed directly into the operational amplifier 104 which amplifies the signal and provides a buffer between the input signal and operational amplifier 108. Since $V_{det}$ is proportional to the input and output signal of the LNA, $V_{det}$ increases as the output of the LNA increases, and $V_{det}$ decreases as the output of the LNA decreases. The operational amplifier 108 operates to decrease $V_{int}$ as $V_{det}$ increases, and increase $V_{int}$ as $V_{det}$ decreases. The output $V_{int}$ of the operational amplifier 108 is applied to the logic control circuit 116 which controls the output signal $V_{bias}$ 118.

The signal FECS 114 comes from a radio frequency and baseband frequency interface module, described below, or other suitable control circuitry. The signal FECS is enabled when the radio frequency and baseband frequency interface module is unable to detect the received signal and asserts the FECS to directly control the bias voltage to decrease or increase the bias of the LNA. Such a situation might occur when an interfering signal is applied to the input of the LNA which renders the desired signal undetectable. In other words, when FECS is set to 0, the output of the operational amplifier 108 is passed by the logic control circuit directly to $V_{bias}$. When FECS is set to a non-zero value, the non-zero value is passed by the logic control circuit directly to $V_{bias}$. As the control circuit 116 decreases $V_{bias}$, the gain of the LNA decreases. Conversely, as $V_{bias}$ increases, the gain of the LNA increases.

Figure 6:
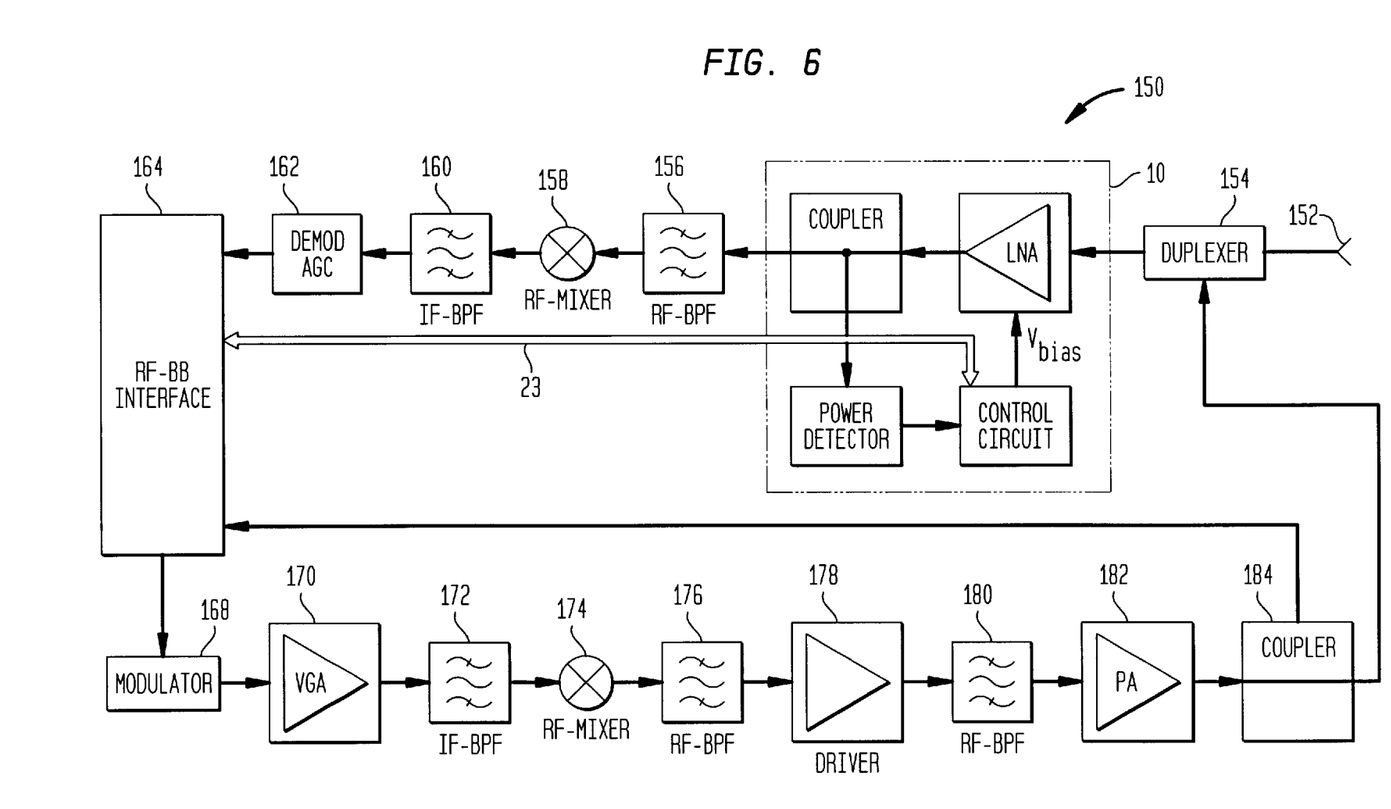
FIG. 6 shows a transmitter and receiver circuit utilizing a variable low noise amplifier in accordance with the present invention.

FIG. 6 shows a block diagram of an exemplary transmitter and receiver circuit 150 suitable for use with the present invention. While the circuit 150 is implemented with the first embodiment of the present invention described above, it will be recognized that the other embodiments of the present invention may also be suitably employed. Further, the circuit 150 is merely exemplary of the transmitters and receivers with which the present invention may be utilized. As would be recognized by one skilled in the art, the present invention may be utilized with a variety of transmitter and receiver circuits.

The transmitter and receiver circuit 150 includes an antenna 152 connected to a duplexer 154. An output of the duplexer 154 is connected to an input of the variable low noise amplifier circuit 10. An output of the variable low noise amplifier circuit 10 is connected to an input of a radio frequency and baseband frequency interface module (RF-BB) 164 through a radio frequency bandpass filter (RF-BPF) 156, a radio frequency mixer 158, an intermediate frequency bandpass filter (IF-BPF) 160, and a demodulator and automatic gain control module 162. The FECS signal 23 is connected between the variable low noise amplifier circuit 10 and the RF-BB interface module 164. The RF-BB interface module 164 is connected to the duplexer 154 through transmitter circuitry which includes a modulator 168, a variable gain amplifier (VGA) 170, an intermediate frequency bandpass filter 172, a radio frequency mixer 174, a radio frequency bandpass filter 176, a driver 178, a radio frequency bandpass filter 180, a power amplifier (PA) 182, and a coupler 184.

Figure 7:
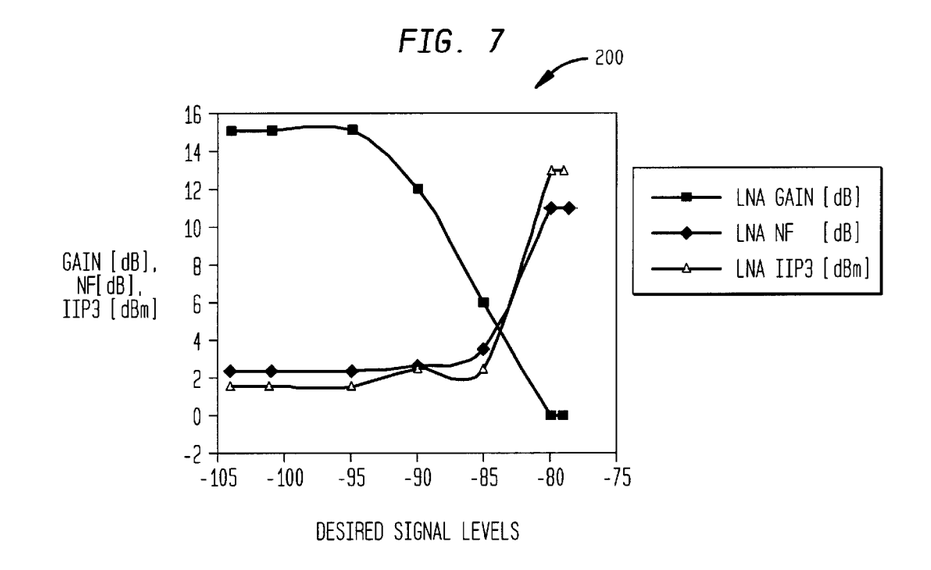
FIG. 7 is a graph showing the relationship between a desired signal level and the LNA gain, LNA NF, and LNA IIP3 in accordance with the present invention.
Figure 8:
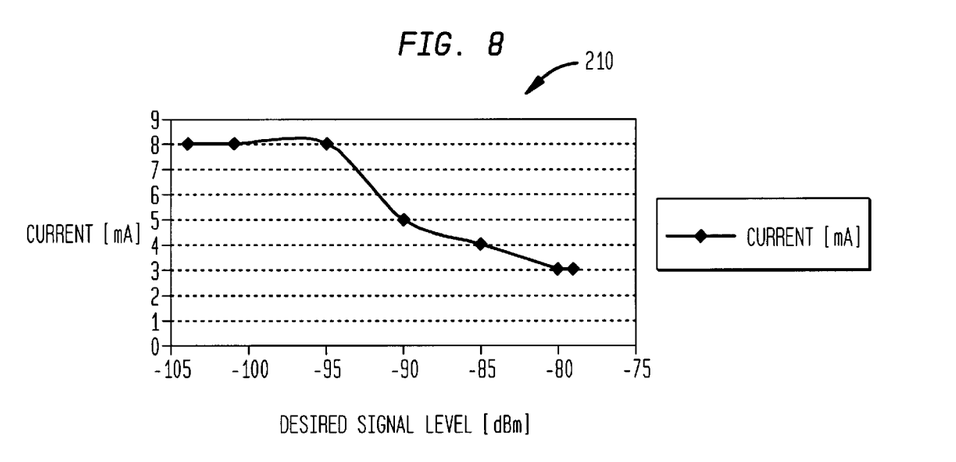
FIG. 8 is a graph showing the relationship between drain current of the LNA and desired signal level in accordance with the present invention.

To illustrate the effect of the variable gain low noise amplifier of the present invention, an analysis of the receiver chain of the transmitter and receiver circuit 150 was performed. The receiver chain was tested for sensitivity and intermodulation performance as detailed in TIA/EIA 98B, "Recommended Minimum Performance Standard for Dual-Mode Spread Spectrum Cellular Mobile Stations". The desired signal was swept from −104 dBm to −79 dBm with FIGS. 7 and 8 showing the results. As detailed in TIA/EIA 98B, the desired signal includes two interfering tones.

FIG. 7 is a graph 200 showing the relationship between the desired signal level and the LNA gain, LNA NF, and LNA IIP3. As described above, at low signal levels, the LNA gain is at a substantially higher value than the LNA NF and LNA IIP3. At higher signal levels, the LNA NF and LNA IIP3 is at a substantially higher value than the LNA gain.

FIG. 8 is a graph 210 showing the relationship between drain current of the LNA and desired signal level. Higher drain current corresponds to higher gain of the LNA.

Figure 9:
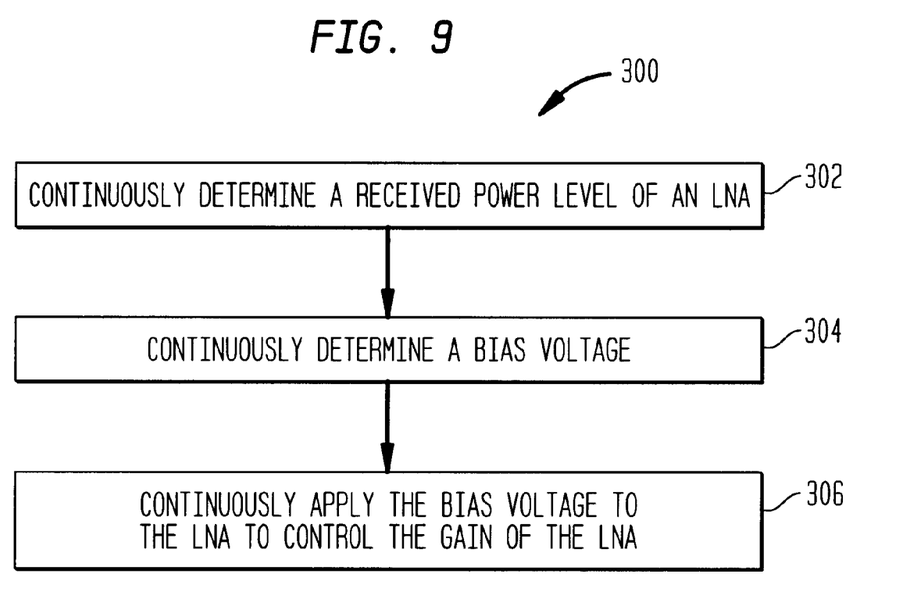
FIG. 9 shows a method of varying the gain of a low noise amplifier according to the present invention.

FIG. 9 shows a method 300 of varying the gain of a LNA based on received RF signal levels in accordance with the present invention. In step 302, a received power level of a RF signal at an input or an output of an LNA, such as LNA 14, is continuously determined by measuring a rectified voltage level. The rectified voltage level may be measured using a power coupler and a power detector, such as power coupler 16 and power detector 20, or diode circuitry, such as diode circuitry 56. In step 304, control circuitry, such as control circuit 22, continuously determines a bias voltage for the LNA such that as the rectified voltage level decreases, the bias voltage increases and the gain of the LNA increases, and as the rectified voltage level increases, the bias voltage decreases and the gain of the LNA decreases. In step 306, the bias voltage is continuously applied to the LNA to control the gain of the LNA. By continuously varying the gain, and thus the current, IIP3 and NF, of the LNA according the received RF signal levels, the LNA achieves wide dynamic range and high power efficiency.

While the present invention has been disclosed in a presently preferred context, it will be recognized that it may be readily applied in a variety of contexts consistent with the present teachings and the claims which follow.

We claim:

1. A method for controlling a gain of a low noise amplifier receiving a radio frequency (RF) communication signal to achieve wide dynamic range and high power efficiency, the method comprising the steps of:

continuously determining a power level of the received RF communication signal;

continuously determining a bias voltage of the low noise amplifier based on the power level such that as the power level decreases, the bias voltage increases and the gain increases, and as the power level in creases, the bias voltage decreases and the gain de creases;

continuously applying the bias voltage to the low noise amplifier to control the gain of the low noise amplifier, if a front end control signal is not active; and automatically activating a front end control signal to control the bias voltage of the low noise amplifier, if an interfering signal is present.

2. The method of claim 1 wherein the power level of the RF communication signal is measured in an input of the low noise amplifier.

3. The method of claim 1 wherein the power level of the RF communication signal is measured in an output of the low noise amplifier.

4. The method of claim 1 wherein the step of continuously determining a power level comprises the substep of:

continuously determining a rectified voltage level of the received communication signal.

5. The method of claim 1 wherein an input third order intercept point increases as the gain of the low noise amplifier decreases, and the input third order intercept point decreases as the gain of the low noise amplifier increases.

6. The method of claim 1 wherein a noise figure of the low noise amplifier increases as the gain of the low noise amplifier decreases, and the noise figure of the low noise amplifier decreases as the gain of the low noise amplifier increases.

7. The method of claim 1 further comprising the step of:

utilizing the low noise amplifier in a receiver of a wireless communication system.

8. The method of claim 7 wherein the wireless communication system is a code division multiple access system.

9. An apparatus for controlling the gain of a low noise amplifier receiving a radio frequency (RF) communication signal to achieve wide dynamic range and high power efficiency comprising:

monitor circuitry for continuously determining a power level of the received RF communication signal;

control circuitry connected to the monitor circuitry for continuously determining a bias voltage of the low noise amplifier based on the power level such that as the power level decreases, the bias voltage increases and the gain increases, and as the power level increases, the bias voltage decreases and the gain decreases, said control circuitry further for continuously applying the bias voltage to the low noise amplifier to control the gain of the low noise amplifier, if a front end control signal is not active; and a front end control override signal input to the control circuitry such that when the override signal is set to zero the bias voltage is applied to the low noise amplifier, and when an interfering signal is present the override signal is set to a nonzero value and the override signal is applied to bias the low noise amplifier.

10. The apparatus of claim 9 wherein the monitor circuitry comprises:

at least one diode.

11. The apparatus of claim 10 wherein the diode is connected to an input of the low noise amplifier.

12. The apparatus of claim 10 wherein the diode is connected to an output of the low noise amplifier.

13. The apparatus of claim 10 wherein the monitor circuitry comprises:

a power coupler; and a power detector connected to an output of the power coupler.

14. The apparatus of claim 13 wherein the power coupler is connected to an output of the low noise amplifier.

15. The apparatus of claim 13 wherein the power coupler is connected to an input of the low noise amplifier.

16. The apparatus of claim 9 wherein the control circuitry comprises:

a voltage follower connected to the monitor circuitry;

an integrator connected to the voltage follower for producing an integrated signal; and a logic control circuit connected to the integrator for applying the bias voltage to the low noise amplifier.

* * * * *